US006579421B1

(12) United States Patent
Fu

(10) Patent No.: US 6,579,421 B1
(45) Date of Patent: *Jun. 17, 2003

(54) TRANSVERSE MAGNETIC FIELD FOR IONIZED SPUTTER DEPOSITION

(75) Inventor: Jianming Fu, San Jose, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/226,739

(22) Filed: Jan. 7, 1999

(51) Int. Cl.[7] .................. C23C 14/35; C23C 14/38; C23C 14/40
(52) U.S. Cl. .............. 204/192.12; 204/298.2; 204/298.06; 204/298.15; 204/298.16; 204/298.07; 204/298.08
(58) Field of Search ............ 204/298.06, 298.2, 204/298.16, 298.15, 192.12, 298.07, 298.08

(56) References Cited

U.S. PATENT DOCUMENTS

| 3,669,860 A | 6/1972 | Knowles et al. ....... 204/298.16 |
| 4,412,905 A | 11/1983 | Khan ................. 204/192.11 |
| 4,422,896 A | 12/1983 | Class et al. ............ 156/345 |
| 4,498,969 A | 2/1985 | Ramachandran ........ 204/192.12 |
| 4,581,118 A | 4/1986 | Class et al. ........... 204/298.16 |
| 4,631,106 A | 12/1986 | Nakazato et al. ........ 204/298.2 |
| 4,657,619 A | 4/1987 | O'Donnell ............. 204/192.32 |
| 4,668,338 A | 5/1987 | Maydan et al. ............ 438/714 |
| 4,668,365 A | 5/1987 | Foster et al. ........... 204/192.23 |
| 4,673,482 A | 6/1987 | Setoyama et al. ........ 204/192.2 |
| 4,716,491 A | 12/1987 | Ohno et al. ............ 204/192.34 |
| 4,761,219 A | 8/1988 | Sasaki et al. ........... 156/345 |
| 4,829,215 A | 5/1989 | Kim et al. ............. 315/111.41 |
| 4,853,102 A | 8/1989 | Tateishi et al. ......... 204/298.06 |
| 4,865,709 A | 9/1989 | Nakagawa et al. ....... 204/192.12 |
| 4,865,712 A | 9/1989 | Mintz ................... 204/298.16 |

(List continued on next page.)

FOREIGN PATENT DOCUMENTS

| DE | 0261812 | 6/1987 |
| EP | 0 223 975 | 3/1987 |
| EP | 0607797 | 6/1997 |
| JP | 61158032 | 7/1986 |
| JP | 61221363 | 10/1986 |
| JP | 61272373 | 12/1986 |
| JP | 63018071 | 1/1988 |
| JP | 63262462 | 10/1988 |
| JP | 1309963 | 12/1989 |
| JP | 63213667 | 9/1998 |

OTHER PUBLICATIONS

S.M. Rossnagel & J. Hopwood, "Metal ion deposition from ionized magnetron sputtering discharge," Jan./Feb. 1994, J. Vac. Sci. Technol. B 12 (1), pp. 449–453.

(List continued on next page.)

Primary Examiner—Mark F. Huff
Assistant Examiner—Deborah Chacko-Davis
(74) Attorney, Agent, or Firm—Konrad Raynes & Victor, LLP

(57) ABSTRACT

Ionized sputter deposition apparatus and method employing a low frequency or DC transverse magnetic field to increase the transverse component of the trajectory of sputtered material ions being deposited on the workpiece. Adjusting the strength of the magnetic field will adjust the trajectory angles of the sputtered material being deposited on the workpiece, thereby controlling the ratio between the deposition rates on the upper and lower side walls of openings in the workpiece. Accordingly, the invention permits optimizing the top-to-bottom uniformity of layers deposited on the side walls by adjusting the strength of the magnetic field. The invention is especially useful for depositing thin wetting layers or side wall barrier layers having uniform thickness.

31 Claims, 2 Drawing Sheets

U.S. PATENT DOCUMENTS

| | | | | |
|---|---|---|---|---|
| 4,871,433 A | | 10/1989 | Wagner et al. | 204/192.12 |
| 4,999,096 A | | 3/1991 | Nihei et al. | 204/192.15 |
| 5,006,218 A | | 4/1991 | Yoshida et al. | 204/298.06 |
| 5,026,470 A | | 6/1991 | Bonyhard et al. | 204/192.2 |
| 5,178,739 A | * | 1/1993 | Barnes et al. | 204/298.06 |
| 5,215,619 A | | 6/1993 | Cheng et al. | 156/345 |
| 5,225,024 A | | 7/1993 | Hanley et al. | 156/345 |
| 5,234,560 A | | 8/1993 | Kadlec et al. | 204/192.16 |
| 5,246,532 A | | 9/1993 | Ishida | 118/723 MA |
| 5,271,788 A | | 12/1993 | Hasegawa et al. | 156/345 |
| 5,308,417 A | | 5/1994 | Groechel et al. | 216/67 |
| 5,431,799 A | * | 7/1995 | Mosely et al. | 204/298.06 |
| 5,439,574 A | | 8/1995 | Kobayashi et al. | 204/192.12 |
| 5,444,207 A | | 8/1995 | Sekine et al. | 219/121.43 |
| 5,449,977 A | | 9/1995 | Nakagawa et al. | 315/111.51 |
| 5,455,197 A | | 10/1995 | Ghanbari et al. | 204/192.13 |
| 5,456,796 A | | 10/1995 | Gupta et al. | 118/723 E |
| 5,496,455 A | | 3/1996 | Dill et al. | 204/298.16 |
| 5,534,108 A | | 7/1996 | Qian et al. | 216/68 |
| 5,589,039 A | | 12/1996 | Hsu | 204/192.12 |
| 5,593,551 A | | 1/1997 | Lai | 204/192.12 |
| 5,639,357 A | * | 6/1997 | Xu | 204/298.06 |
| 5,902,461 A | | 5/1999 | Xu et al. | 204/298.06 |
| 5,945,008 A | * | 8/1999 | Kisakibaru et al. | 204/298.16 |
| 5,980,687 A | * | 11/1999 | Koshimizu | 204/192.12 |
| 6,077,403 A | | 6/2000 | Kobayashi et al. | 204/192.12 |
| 6,099,706 A | | 8/2000 | Hirabayashi et al. | 118/728 |
| 6,106,682 A | | 8/2000 | Moslehi et al. | 118/500 |
| 6,113,731 A | | 9/2000 | Shan et al. | 118/723 MA |
| 6,136,166 A | | 10/2000 | Shen et al. | 118/500 |
| 6,159,351 A | | 12/2000 | J'Afer et al. | 204/192.12 |
| 6,224,724 B1 | | 5/2001 | Licata et al. | 204/298.06 |
| 6,235,164 B1 | | 5/2001 | Gerrish et al. | 204/192.12 |
| 6,352,629 B1 | | 3/2002 | Wang | 204/298.2 |
| 6,368,469 B1 | | 4/2002 | Nulman et al. | 204/192.12 |

OTHER PUBLICATIONS

U.S. patent application Ser. No. 09/993,543 filed Nov. 14, 2001; "Magnet Array in Conjunction with Rotating magnetron for Plasma Sputtering", 16 pp. (atty dkt AM–6265).

EP 97303124.8 filed May 8, 1997; claiming priority of U.S. 08/680,355 filed May 9, 1996; atty dkt 4979.

US patent application Ser. No. 08/559,345 filed Nov. 15, 1996; atty dkt 4479.

US patent application Ser. No. 08/733,620 filed Oct. 17, 1996; atty dkt 4906.

US patent application Ser. No. 08/851,946 filed May 6, 1997; atty dkt 5491.

US patent application Ser. No. 09/049,839 filed Mar. 27, 1998; atty dkt 5702.

\* cited by examiner

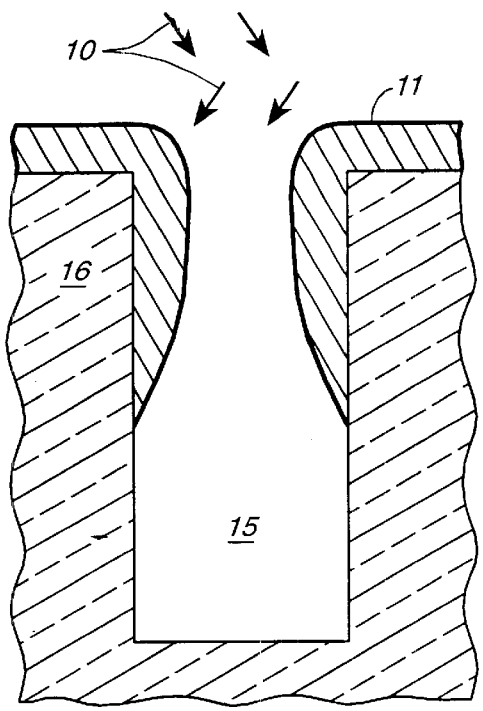
*FIG._1* (PRIOR ART)
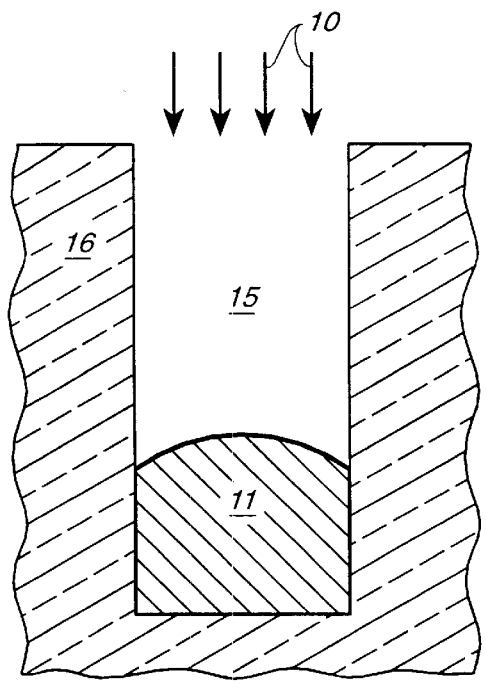
*FIG._2* (PRIOR ART)
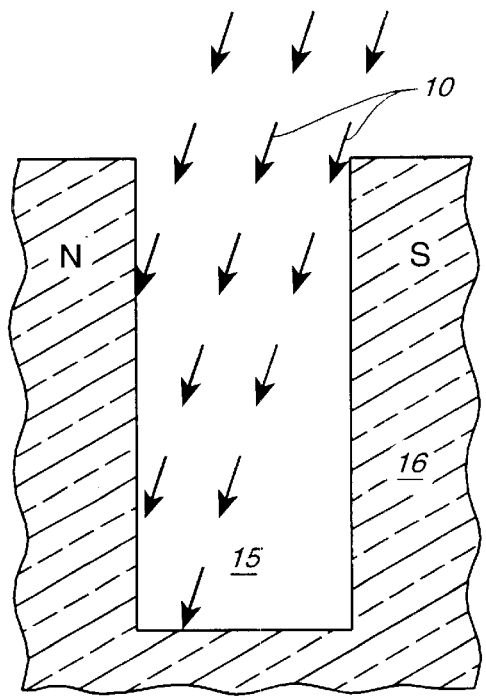
*FIG._5*
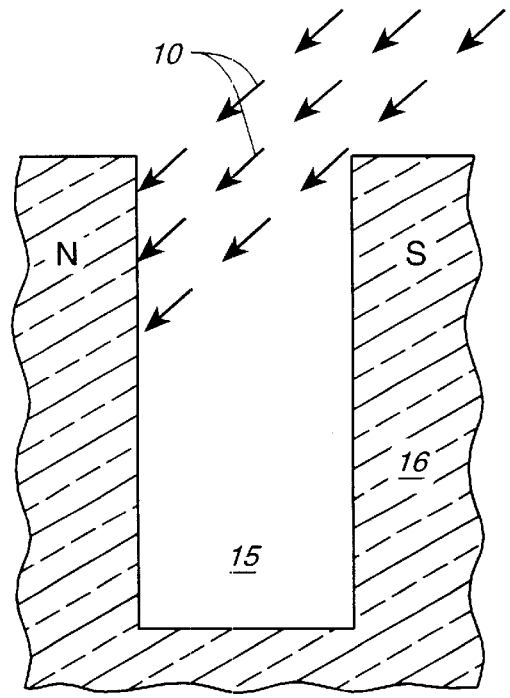
*FIG._6*

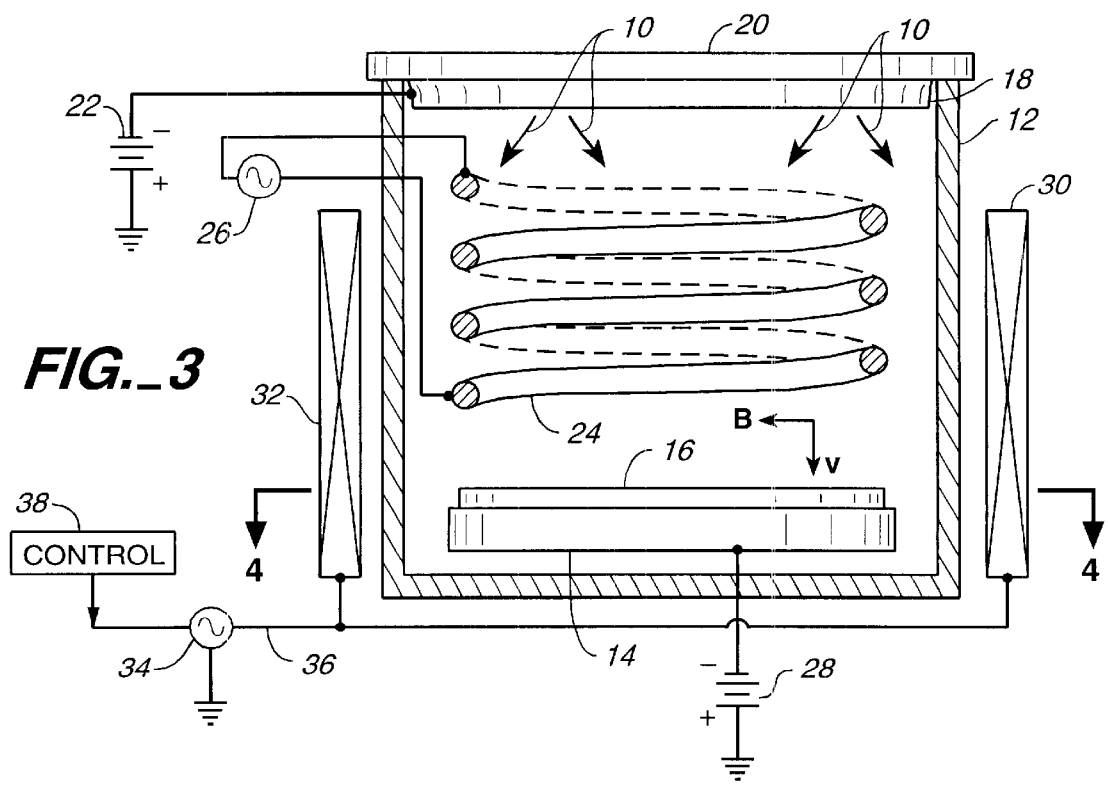
FIG._3
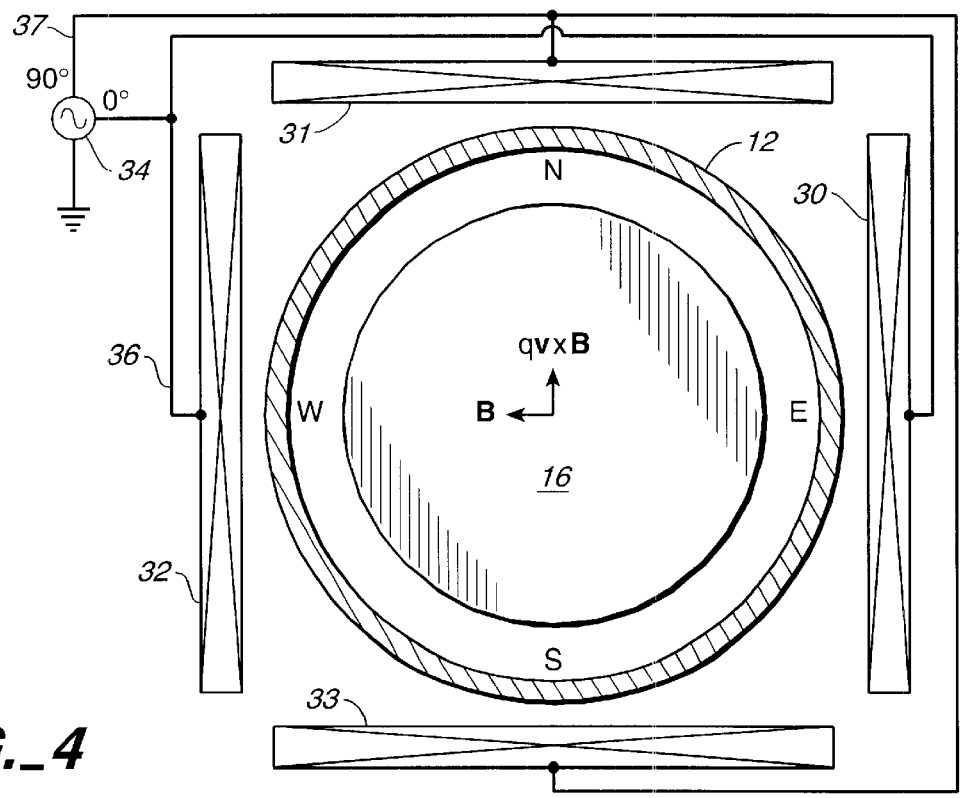
FIG._4

TRANSVERSE MAGNETIC FIELD FOR IONIZED SPUTTER DEPOSITION

TECHNICAL FIELD OF THE INVENTION

The invention relates to sputter deposition of ionized material, such as ionized metal plasma sputter deposition, for manufacturing a semiconductor workpiece. More specifically, the invention relates to methods and apparatus for using a low frequency or DC transverse magnetic field to control the directivity of the ions of sputtered material deposited in openings in a workpiece.

BACKGROUND ART

Sputter deposition is a process commonly used to deposit films, typically of metal or metal compounds, on semiconductor workpieces during the fabrication of semiconductor devices. In sputter deposition, the semiconductor workpiece and a target are mounted within a vacuum chamber. A sputtering gas such as argon is flowed into the chamber while a DC power supply applies a negative voltage to the target relative to the electrically grounded metal walls of the chamber. The negative target voltage excites the argon gas near the target into a plasma state and accelerates argon ions from the plasma to bombard the target. The bombardment of the target causes an emission (i.e., sputtering) of atoms from the target surface. The sputtered atoms of target material leave the target with a distribution of angular trajectories so that the sputtered atoms deposit to varying degrees on all exposed surfaces in the chamber. The semiconductor workpiece is mounted close to, and parallel to, the target so that high proportion of the sputtered target atoms deposit on the workpiece.

In a non-ionized sputter deposition process, the plasma occupies a relatively small region near the target, and only a very small proportion of sputtered target atoms are ionized in the plasma. Because almost all of the sputtered atoms are neutral, any DC voltage applied to the semiconductor workpiece would have little effect on the angular trajectories of the sputtered atoms, so the workpiece typically is left electrically floating.

FIG. 1 illustrates an opening 15 (such as a via, plug, or trench) in a semiconductor wafer 16 being filled by sputtered target material 11 in a conventional non-ionized sputter deposition process. Because a high proportion of the sputtered atoms 10 of target material arrive at the wafer with highly non-perpendicular trajectory angles, an excessive amount of the sputtered target material will deposit on the upper part of the side walls of the openings, and an insufficient amount will deposit on the bottom and lower part of the side walls of the openings. Consequently, nonionized sputter deposition can be unsatisfactory for filling openings having high aspect ratio, i.e., a high ratio of depth to width.

An ionized sputter deposition process is the same as the non-ionized process just described, but it additionally employs an RF power source to excite a relatively high density plasma in a region between the target and the semiconductor workpiece. The RF-excited plasma ionizes a high proportion of the atoms sputtered off the target. A second DC power supply applies a negative voltage to the semiconductor workpiece relative to the electrically grounded metal walls of the chamber. The negative voltage on the workpiece relative to the plasma accelerates the ionized sputtered target atoms so that they impact the workpiece with more perpendicular trajectories than in non-ionized sputtering, which greatly increases the amount of material deposited at the bottom of high aspect ratio openings in the workpiece, as shown in FIG. 2.

Ionized sputtering can be a good deposition method when the objective is to completely fill the openings in the workpiece, but it can be too extreme a solution to the shortcomings of nonionized sputter deposition when the objective is to deposit only a thin wetting layer or barrier layer of uniform thickness on the side walls of the openings. Specifically, while non-ionized sputter deposition often deposits too high a proportion of the sputtered material on the upper walls of openings, ionized sputter deposition often deposits too high a proportion on the lower walls of openings, leaving inadequate coverage of the upper walls, as shown in FIG. 2.

A need exists for a sputter deposition apparatus and process that facilitates adjusting the proportion between deposition rates on the upper and lower walls of openings in the workpiece so as to improve the top-to-bottom uniformity of the thickness of the deposited material.

SUMMARY OF THE INVENTION

The invention is an ionized sputter deposition apparatus and method that employs a low frequency or DC transverse magnetic field to increase the transverse component of the trajectory of ions of sputtered material being deposited on the workpiece.

Adjusting the strength of the magnetic field will adjust the trajectory angles of the sputtered material being deposited on the workpiece, thereby controlling the ratio between the deposition rates on the upper and lower side walls of openings in the workpiece. Therefore, the invention permits optimizing the top-to-bottom uniformity of layers deposited on the side walls by adjusting the strength of the magnetic field.

The invention is especially useful for depositing thin wetting layers or side wall barrier layers having uniform thickness.

BRIEF DESCRIPTION OF THE DRAWINGS

FIG. 1 is a schematic sectional view of a workpiece opening partially filled by a conventional non-ionized sputter deposition process.

FIG. 2 is a schematic sectional view of a workpiece opening partially filled by a conventional ionized sputter deposition process.

FIG. 3 is a schematic sectional side view of a sputtering chamber of the present invention.

FIG. 4 is a schematic sectional top view of the sputtering chamber.

FIG. 5 is a schematic sectional view of a workpiece opening showing the trajectories of ions of sputtered target material when the strength of the transverse magnetic field is optimum.

FIG. 6 is a schematic sectional view of a workpiece opening showing the trajectories of ions of sputtered target material when the strength of the transverse magnetic field is too high.

BEST MODES FOR CARRYING OUT THE INVENTION

1. Conventional Aspects of Sputtering Chamber and Process

FIGS. 3 and 4 show a presently preferred embodiment of an ionized metal plasma sputtering chamber which includes a low frequency or DC transverse magnetic field according to the present invention. The conventional portions of the chamber will be described before describing the invention.

The vacuum chamber enclosure 12 has a cylindrical side wall and a circular bottom wall, both electrically grounded and typically composed of aluminum. A disc-shaped wafer support chuck 14 has a flat upper surface on which a robot (not shown) places a semiconductor wafer 16 to be processed within the chamber. The wafer typically is secured on the chuck by either a clamp ring or an electrostatic chuck (not shown).

A magnetron target assembly is mounted on the top of the chamber body 12. The target assembly includes a disc-shaped target 20 attached to a rigid backing plate 18. Magnets (not shown) immediately above (i.e., behind) the backing plate create a magnetic field which enhances plasma density near the exposed lower surface of the target 20.

A sputtering gas such as argon flows into the chamber at a controlled flow rate, typically on the order of 50 sccm, through a gas inlet port (not shown) near the top of the chamber. A vacuum pump (not shown) exhausts gas from the chamber through an exhaust port (not shown) near the bottom of the chamber and regulates the total chamber pressure at a desired level, typically on the order of 0.1 to 50 milliTorr.

A target power supply 22 supplies to the target 20 a DC voltage that is negative relative to the electrically grounded chamber wall 12. The target power supply typically delivers about −400 volts to the target at a power level on the order of 2,000 watts. This voltage excites the sputtering gas into a plasma state in a region just below the target 20. The negative target voltage accelerates argon ions to bombard the target, which causes emission—i.e., sputtering—from the target of atoms (or molecules, if the target material is a chemical compound) of target material. Each sputtered target atom initially travels in a straight trajectory from the target, but the numerous sputtered atoms have straight trajectories whose directions are distributed over a broad range of angles, as represented by the arrows 10 below the target in FIG. 3.

While a disc-shaped sputtering target at the top of the chamber is the most commonly used design, the present invention can be used with any ionized sputter chamber design. For example, a hollow cathode magnetron sputtering target is described in U.S. Pat. No. 5,178,739 to Barnes et al., the entire disclosure of which is hereby incorporated into this patent specification. Barnes's hollow cathode magnetron employs a cylindrical target coaxial with and just inside the cylindrical wall of the chamber. A plurality of permanent magnets encircles the chamber wall to create a cusp-shaped magnetic field in the region adjacent to the target, thereby enhancing the density of the plasma.

The chamber further includes an RF power supply 26 and means for coupling power from the RF power supply into the plasma so as to ionize the sputtered target atoms. While any RF coupling means can be used, the most commonly used RF coupling means are: an RF induction coil for inductively coupling the RF power to the plasma; an RF antenna for radiating the RF power; electrodes for capacitively coupling the RF power; and a waveguide for coupling RF power from a microwave RF power supply. RF antennas and capacitive coupling electrodes are described in commonly assigned U.S. Pat. No. 5,431,799 to Mosely et al. Induction coils are described in U.S. Pat. No. 5,178,739 to Barnes et al. and in S. M. Rossnagel et al., "Metal Ion Deposition from Ionized Magnetron Sputtering Discharge", J. Vac. Sci. Technol. B, vol. 12, no. 1, January/February 1994, pp. 449–453. The Barnes patent also describes a microwave waveguide. The entire disclosures of the Mosely patent, the Barnes patent, and the Rossnagel article are hereby incorporated into this patent specification. It also is conceivable that the magnetron source alone can ionized the sputtered target material without an additional RF power supply 26, provided the target power supply 22 supplies a high enough power and the target magnets produce a sufficiently strong magnetic field.

The presently preferred embodiment shown in FIG. 3 employs an RF induction coil 24 which encircles a region in the chamber between the wafer 16 and the target 20. The induction coil is mounted to the cylindrical side wall of the chamber enclosure 12 by dielectric spacers or standoffs (not shown) which electrically insulate the coil from the electrically grounded chamber wall. In the preferred embodiment, the induction coil power supply 26 supplies to the induction coil 24 roughly 1,500 watts of RF power at a frequency of 2 MHz. Other RF frequencies conventionally used for inductively coupled plasmas, including the commonly used frequency of 13.54 MHz, also should be suitable.

Most of the sputtered atoms 10 of target material will enter the region encircled by the RF induction coil 24. The RF power applied to the induction coil excites the mixture of argon sputtering gas and sputtered target atoms 10 into a high density plasma state. If the RF power is sufficient, and if the chamber pressure is within an optimum range of about 10 mTorr to 50 mTorr, most of the sputtered target atoms 10 will be ionized within this high density plasma. (The well known conditions for maximizing ionization of sputtered atoms are described in the Rossnagel article and the Barnes patent cited above.)

A bias power supply 28 applies to the workpiece 16 a DC bias voltage that is negative relative to the plasma body, typically at a voltage in the range of zero to −200 volts, and more preferably in the range of −10 to −50 volts. The bias power supply can be either a DC power supply or an AC power supply coupled to the workpiece through a capacitor across which the DC bias voltage appears. Both alternatives are conventional. The negative bias voltage on the wafer 16 relative to the plasma body produces an electric field across the plasma sheath. This electric field accelerates the ions of target material so that their trajectories are nearly perpendicular to the wafer 16 when the target material ions impact the wafer. Consequently, the target material can fill higher aspect ratio openings in the wafer than would be possible with non-ionized sputtering.

As stated above in the "Background Art" section, ionized sputtering can have a disadvantage that is the opposite of non-ionized sputtering; the ionized target material can impact the wafer with such uniformly perpendicular trajectories that insufficient material 11 is deposited on the sides of the openings 15 in the wafer, as shown in FIG. 2. This is undesirable if the material is not intended to fill the openings, but is intended to form a uniformly thick layer over the side walls of the openings.

2. Transverse Magnetic Field

To overcome the shortcomings of conventional ionized sputter deposition chambers and processes, the present invention employs a low frequency or DC magnetic field oriented approximately transverse to the longitudinal axis of the sputtering chamber, i.e., approximately parallel to the surface of the workpiece 16.

In the presently preferred embodiment, the magnetic field is produced by a set of four low frequency or DC electromagnet coils 30–33 spaced around the cylindrical chamber wall, where the axis of each coil is directed toward the center of the workpiece 16, as shown in FIGS. 3 and 4. For explanatory purposes, the azimuthal directions around the longitudinal axis of the chamber will be identified as east (0° azimuth), north (90°), west (180°), and south (270°). Using this convention, the four coils 30, 31, 32 and 33 are located at the east, north, west, and south positions, respectively.

To understand the invention, initially assume the design is a simplified one in which the north and south coils 31, 33 do not exist. Also assume that the east and west coils 30, 32 are both connected to receive DC electric current from a power supply 34 so that current flows through both coils in a clockwise direction. In that case, the coils will produce inside the chamber a transverse magnetic field pointing in the west direction, as represented by the vector B in FIGS. 3 and 4.

Because the bias power supply 28 biases the wafer 16 negative relative to the plasma body, the ions of sputtered target material in the plasma travel toward the wafer with an average velocity represented by the vector v in FIG. 3. Consequently, the magnetic field will apply to the ions of sputtered target material a Lorentz force F=qv×B—commonly called an E×B force—which is directed north as shown in FIG. 4.

The qv×b force will add a north-directed component to the trajectories of the ions 10 of sputtered target material, so that their trajectories no longer are perpendicular to the workpiece 16. This will increase the deposition of sputtered target material on the north side wall of every opening in the workpiece, as depicted in FIG. 5. However, if the magnetic field is too strong, the north-directed component of the trajectories of the ions will be too great as depicted in FIG. 6, and there will be too little material deposited on the bottom of the openings and on the lower portions of the side walls. Therefore, the optimum strength of the magnetic field to obtain a desired distribution of deposited material should be determined empirically. The magnetic field strength is adjusted by adjusting the voltage or current supplied by the electromagnet power supply 34. In a chamber designed for ionized sputter deposition on a single 200 mm silicon wafer, a magnetic field in the range of 200 to 500 gauss is expected to be optimum.

Most of the velocity of the ionized target material is acquired in the plasma sheath that typically extends only 1 mm above the semiconductor workpiece 16, and in the plasma pre-sheath that typically extends 1 to 3 cm above the sheath. Therefore, there is no need for the magnet to produce a transverse magnetic field in the entire region occupied by the plasma between the sputtering target 18 and the workpiece 16. The magnetic field is important only in the plasma sheath and pre-sheath, i.e., about 3 cm above the workpiece.

Of course, a steady state magnetic field directed west only enhances deposition on the north face of each side wall. To similarly enhance deposition on the other faces of the side walls, the magnetic field should be rotated about the longitudinal axis of the chamber. In theory, this could be accomplished by mechanically revolving the two electromagnets 30 and 32 about the chamber axis. However, the required mechanical assembly would be bulky, and it would be difficult to ensure reliable electrical contact to the revolving coils. Therefore, it is preferable to rotate the magnetic field by electrical rather than mechanical means.

The magnetic field can be rotated 180° simply by controlling the power supply 34 to reverse the direction of current flow through the east and west electromagnets 30, 32. This will enhance deposition on the south face of each side wall. Therefore, if it is only necessary to improve deposition uniformity on the north and south side walls of narrow trenches in the workpiece that extend parallel to the east-west axis, periodically reversing the direction of current flow through the east and west electromagnets may produce the required deposition uniformity.

If it is necessary to improve side wall deposition uniformity in all directions, north and south coils 31, 33 can be added as shown in FIG. 4. A switching circuit (not shown) between the power supply and the four electromagnet coils 30–33 can periodically cycle through four magnetic field orientations in 90° increments by the following steps: (1) conduct current from the power supply to the east and west coils in phase so that each coil 30, 32 produces an east-directed magnetic field; (2) conduct current to the north and south coils in phase so that each coil 31, 33 produces a north-directed magnetic field; (3) supply current to the east and west coils in the opposite phase of step 1, so as to produce a west-directed magnetic field; (4) supply current to the north and south coils in the opposite phase of step 2, so as to a produce south-directed magnetic field.

FIG. 4 shows our presently preferred design for slowly rotating the magnetic field by increments smaller than 90°. The power supply 34 has first and second outputs 36 and 37 which provide approximately sinusoidal electrical current or voltage waveforms which are identical except for a phase offset of 90°. The first output 36 connects to the east and west electromagnet coils 30 and 32, and the second output connects to the north and south coils 31 and 33. This "quadrature" connection is a well known method of producing a magnetic field that rotates about the longitudinal axis of the chamber with a rotation period equal to the repetition period of the power supply output waveform. We presently prefer a rotation frequency of 0.1 Hz to 60 Hz, i.e., a rotation period in the range of 0.02 second to 10 seconds.

The electromagnet power supply 34 can be a very low frequency oscillator that produces a continuous sinusoidal waveform. However, the required waveform can be produced with much more energy efficiency by a digitally controlled power supply that produces a step-wise approximation to the desired waveform. Such a power supply will rotate the magnetic field incrementally instead of continuously. The power supply can be controlled by a conventional programmable microprocessor or controller circuit 38. In addition to controlling the rotational steps of the magnetic field, the controller 38 can command the power supply to adjust the amplitude of its output so as to adjust the magnetic field strength to optimize the side wall deposition uniformity for a particular process.

The controller also could be programmed to change the magnetic field strength over time. For example, it may be desirable to initiate an ionized sputter deposition process with a relatively low magnetic field strength so as to produce good coverage of the bottoms and lower side walls of the openings with minimal overhang of deposited material at the tops of the openings, and to increase the magnetic field strength later in the deposition process so as to increase the amount of material deposited on the upper portions of the side walls.

The same controller 38 also can control the other power supplies 22, 26, 28, preferably by connecting to all of them via a conventional shared digital bus, not shown.

Slowly rotating transverse magnetic fields commonly are used in magnetically enhanced plasma etch chambers. An example is described in commonly assigned U.S. Pat. No.

5,215,619 issued Jun. 1, 1993 to Cheng et al., the entire disclosure of which is hereby incorporated into the present patent specification. The primary function of a transverse magnetic field in a plasma etch chamber is to enhance the plasma density by accelerating electrons in the plasma. This is quite different from the primary function of the transverse magnetic field in the ionized sputter deposition chamber of my invention, which is to adjust the trajectory of ionized sputtered target material so as to adjust the distribution of deposited material on the side walls of openings in the workpiece. Notwithstanding the differences in their functions, the various conventional designs of magnets and rotation methods used for magnetically enhanced plasma etching generally are useful in my invention.

For example, an alternative design for producing a slowly rotating magnetic field is described in U.S. Pat. No. 5,444,207 issued Aug. 22, 1995 to Sekine et al., the entire disclosure of which is hereby incorporated into this patent specification. That design employs about 16 permanent bar magnets mounted on an annular turntable that encircles a plasma etch chamber. The turntable is mechanically rotated in order to rotate the magnetic field. One potential disadvantage of permanent magnets that the magnetic field strength they produce cannot readily be adjusted the way an electromagnet can be adjusted as described above. The Sekine patent describes a design permitting adjustment of the magnetic field by mounting two annular turntables coaxially, and rotating one independently of the other to adjust the extent to which their respective magnetic fields reinforce or cancel.

What is claimed is:

1. An ionized sputter deposition chamber for depositing a film on a semiconductor workpiece, comprising:
    a vacuum chamber;
    a sputtering target mounted within the chamber;
    a magnetron magnet positioned adjacent the target;
    a workpiece support chuck adapted to hold a semiconductor workpiece at a position within the chamber and spaced from the target along a first axis centered on the workpiece support position;
    a gas inlet adapted to supply a sputtering gas to the interior of the chamber;
    a first bias electrical power supply connected to provide electrical power to the target to bias said target to attract sputtering ions;
    a second ionization electrical power supply adapted to provide RF power to a region within the chamber between the target and the workpiece position so as to ionize a substantial portion of the material sputtered from the target;
    a third bias electrical power supply connected to provide electrical power to the workpiece; and
    an ionized target material deflecting magnet positioned adjacent the workpiece support chuck and adapted to provide an ionized target material deflecting magnetic field having a magnitude sufficient to deflect a portion of the ionized target material in a direction transverse to said first axis prior to being deposited on the workpiece.

2. A chamber according to claim 1, wherein the ionized target material deflecting magnet is controllable to adjust the magnitude of the magnetic field, so as to adjust deflection of the ionized target material in a direction transverse to said first axis.

3. A chamber according to claim 2, wherein the workpiece defines openings having sidewalls and the magnetic field has a magnitude sufficient to increase the rate at which material sputtered from the target deposits on upper portions of side walls of openings in the workpiece relative to the rate at which it deposits on lower portions of said side walls.

4. A chamber according to claim 1, wherein:
    the position at which the chuck holds the workpiece is planar and is perpendicular to said first axis; and
    the magnetic field produced by the ionized target material deflecting magnet is parallel to the planar workpiece position.

5. A chamber according to claim 1, wherein the ionized target material deflecting magnet is adapted to rotate the magnetic field around said first axis.

6. A chamber according to claim 5, wherein the ionized target material deflecting magnet comprises:
    a magnet assembly including a plurality of permanent magnets encircling the chamber; and
    a motor adapted to mechanically rotate the permanent magnets.

7. A chamber according to claims, wherein the ionized target material deflecting magnet comprises:
    four electromagnets azimuthally spaced around the chamber, each electromagnet having an axis perpendicular to said first axis; and
    a fourth electrical power supply connected to supply an alternating current to the four electromagnets in a quadrature phase relationship, so that the current produces in the four electromagnets a magnetic field that rotates around said first axis.

8. The chamber according to claim 5, wherein said ionized target material deflecting magnetic field rotates at a frequency between 0.1 and 60 Hz.

9. The chamber according to claim 1, wherein said ionized target material deflecting magnetic field is oriented perpendicular to said first axis.

10. The chamber according to claim 1, wherein the magnitude of said ionized target material deflecting magnetic field is within a range of 200–500 gauss.

11. The chamber according to claim 1, wherein said chamber has a sheath region above the surface of the workpiece and a presheath region extending from 1 to 3 cm. above the sheath region through which the ionized material passes prior to being deposited onto said workpiece, and wherein said ionized target material deflecting magnetic field extends through at least said presheath region.

12. The chamber according to claim 1, wherein the sputtering gas is excited into a plasma state by the electrical power supplied by one or more of the power supplies, so as to produce a plasma within the chamber between the target and the workpiece position;
    wherein the third bias electrical power supply provides to the workpiece a bias voltage that is negative relative to the plasma so as to accelerate the ionized target material toward the workpiece position; and
    wherein a portion of the ionized target material is deflected by said ionized target material deflecting magnetic field of said ionized target material deflecting magnet prior to being deposited on said workpiece.

13. A method of sputter depositing a film on a semiconductor workpiece, comprising:
    providing a vacuum chamber;
    mounting a sputtering target within the chamber;
    producing a magnetron magnetic field adjacent said target to generate sputtering ions adjacent said target;
    holding a semiconductor workpiece at a position within the chamber that is spaced apart from the target along a first axis;

supplying a sputtering gas to the interior of the chamber;

exciting the sputtering gas to form a plasma having a plasma body;

applying electrical power to the target so as to sputter materials from the target;

applying RF power to a region within the chamber between the target and the workpiece so as to ionize a substantial portion of the material sputtered from the target;

applying to the workpiece a bias voltage that is negative relative to the plasma so as to accelerate the ionized target material toward the workpiece; and producing an ionized target material deflecting magnetic field oriented adjacent to said workpiece field with a magnitude sufficient to deflect the ionized target material in a direction transverse to said first axis and through said region and centered closer to said workpiece than said target.

14. A method according to claim 13, wherein said producing a magnetic field comprises;

producing the ionized target material deflecting magnetic field with a magnitude sufficient to increase the ratio between the rate at which material sputtered from the target deposits on upper portions of side walls of openings in the workpiece and the rate at which it deposits on lower portions of said side walls.

15. A method according to claim 3, further comprising:

adjusting the magnitude of the ionized target material deflecting magnetic field so as to adjust the rate at which material sputtered from the target deposits on upper portions of side walls of openings in the workpiece relative to the rate at which it deposits on lower portions of said side walls.

16. A method according to claim 13, further comprising:

adjusting the magnitude of the ionized target material deflecting magnetic field so as to adjust deflection of the ionized target material in a direction transverse to said first axis.

17. A method according to claim 13, wherein:

in said holding the workpiece at said position, said position is planar and perpendicular to said first axis; and said producing an ionized target material deflecting magnetic field comprises producing the magnetic field so that it is oriented parallel to the planar workpiece position.

18. A method according to claim 13, wherein said producing an ionized target material deflecting magnetic field further comprises:

rotating the ionized target material deflecting magnetic field around said first axis.

19. The method according to claim 18, wherein said ionized target material deflecting magnetic field rotates at a frequency between 0.1 and 60 Hz.

20. A method according to claim 13, further comprising:

adjusting the magnitude of the ionized target material deflecting magnetic field so as to improve the top-to-bottom uniformity of the rate at which material sputtered form the target deposits on side walls of openings in the workpiece.

21. A method according to claim 13, wherein said producing the ionized target material deflecting magnetic field further comprises:

establishing the magnitude of the ionized target material deflecting magnetic field at a first value while depositing a layer of material on the side walls of openings in the workpiece; and then establishing the magnitude of the ionized target material deflecting magnetic field at a second value substantially lower than the first value while depositing additional material in the openings in the workpiece.

22. A method according to claim 21, wherein said establishing the magnitude of the ionized target material deflecting magnetic field at a second value is performed while depositing said additional material so as to fill the openings.

23. The method according to claim 13, wherein said ionized target material deflecting magnetic field is oriented perpendicular to said first axis.

24. The method according to claim 13, wherein the magnitude of said ionized target material deflecting magnetic field is within a range of 200–500 gauss.

25. The method according to claim 13, wherein said chamber has a sheath region above the surface of the workpiece and a presheath region extending from 1 to 3 cm. above the sheath region through which the ionized material passes prior to being deposited onto said workpiece, and wherein said ionized target material deflecting magnetic field extends through at least said presheath region.

26. An ionized sputter deposition chamber for depositing a film on a semiconductor workpiece, comprising:

a vacuum chamber;

a target of sputter material mounted within the chamber;

a magnetron magnet positioned adjacent to said target;

a workpiece support chuck adapted to hold a semiconductor workpiece at a position within the chamber that is spaced apart from the target along an axis centered on said workpiece support position;

a power supply coupled to said support chuck and adapted to bias said workpiece;

a plasma generator adapted to maintain a plasma in region within the chamber between the target and the workpiece position and including said axis so as to ionize a substantial portion of the material sputtered from the target; and ion deflecting magnet means positioned closer to said workpiece support chuck than said target for producing an ion deflecting magnetic field oriented perpendicular to said axis and through said region and centered closer to said workpiece support chuck than said target and rotating about said axis wherein said ion deflecting magnetic field of said ion deflecting magnet has a magnitude sufficient to deflect a portion of the ionized target material in a direction transverse to said axis prior to being deposited on said workpiece.

27. An ionized sputter deposition chamber for depositing a film on a semiconductor workpiece, comprising:

a vacuum chamber;

a sputtering target mounted within the chamber;

a magnetron magnet positioned adjacent to said target to generate a magnetic field adjacent said target wherein sputtering ions are generated adjacent said target;

a workpiece support chuck adapted to hold a semiconductor workpiece at a position within the chamber that is spaced apart from the target along a first axis centered on said workpiece support position;

a first electrical power supply coupled to the target and adapted to bias said target to attract said sputtering ions so as to sputter material from the target;

an RF coil positioned to inductively couple RF power in said chamber to maintain a plasma in a region within the chamber between the target and the workpiece position and including said first axis so as to ionize a substantial portion of the material sputtered from the target;

a second RF electrical power supply coupled to said RF coil;

a third electrical power supply adapted to bias the workpiece so as to accelerate the ionized target material toward the workpiece position; and four electromagnets azimuthally spaced around the chamber, each electromagnet having an axis perpendicular to said first axis and positioned closer to said workpiece support chuck than said target; and a fourth controllable electrical power supply connected to supply an alternating current having a controllable magnitude to the four electromagnets in a quadrature phase relationship, so that the current produces in the four electromagnets a rotating ionized target material deflecting magnetic field having a magnitude as a function of said alternating current magnitude and oriented perpendicular to said first axis and through said region and centered closer to said workpiece support chuck than said target wherein a portion of the ionized target material is deflected by said ionized target material deflecting magnetic field prior to being deposited on said workpiece and to a degree in accordance with said ionized target material deflecting magnetic field magnitude.

28. The chamber of claim 27 wherein the workpiece has side walls and bottom walls which define openings in the workpiece, said chamber further comprising a controller coupled to the fourth power supply and adapted to establish the magnitude of the ionized target material deflecting magnetic field at a first value while material is deposited on bottom walls of openings in the workpiece; and is further adapted to establish the magnitude of the ionized target material deflecting magnetic field at a second value substantially higher than the first value while material is deposited on side walls in openings in the workpiece.

29. The chamber of claim 27 wherein said controller establishes the magnitude of the ionized target material deflecting magnetic field at said first value prior to establishing the magnitude of the ionized target material deflecting magnetic field at said second value.

30. A method of sputter depositing a film on a semiconductor workpiece, comprising:

providing a vacuum chamber;

mounting a sputtering target within the chamber;

producing a magnetron magnetic field adjacent said target to generate sputtering ions adjacent said target holding a semiconductor workpiece at a position within the chamber that is spaced apart from the target along a first axis;

supplying a sputtering gas to the interior of the chamber;

exciting the sputtering gas to form a plasma having a plasma body;

applying electrical power to the target so as to sputter materials from the target;

inductively coupling RF power from an RF coil to a region within the chamber between the target and the workpiece including the first axis so as to ionize a substantial portion of the material sputtered from the target;

applying to the workpiece a bias voltage that is negative relative to the plasma so as to accelerate the ionized target material toward the workpiece; and producing a sputtered material ion deflecting magnetic field oriented perpendicular to said first axis and centered closer to said workpiece than said target;

rotating the ion deflecting magnetic field around said first axis;

adjusting the magnitude of the ion deflecting magnetic field so as to adjust the rate at which material sputtered from the target deposits on upper portions of side walls of openings in the workpiece relative to the rate at which it deposits on lower portions of said side walls.

31. The method according to claim 30, wherein said adjusting comprises:

establishing the magnitude of the ion deflecting magnetic field at a first value while depositing a layer of material on the lower portions of side walls of openings in the workpiece; and then increasing the magnitude of the ion deflecting magnetic field to a second value substantially higher than the first value while depositing additional material on the upper portions of side walls of openings in the workpiece.

* * * * *